US008669816B2

(12) United States Patent
Chen et al.

(10) Patent No.: US 8,669,816 B2
(45) Date of Patent: Mar. 11, 2014

(54) INTEGRATED CIRCUIT DEVICE, ELECTRONIC DEVICE AND METHOD THEREFOR

(75) Inventors: Yen-Horng Chen, Taipei (TW); Augusto Marques, Moscavide (PT); Caiyi Wang, Austin, TX (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/273,231

(22) Filed: Oct. 14, 2011

(65) Prior Publication Data

US 2012/0074993 A1 Mar. 29, 2012

Related U.S. Application Data

(63) Continuation-in-part of application No. 13/115,126, filed on May 25, 2011, now abandoned.

(60) Provisional application No. 61/386,885, filed on Sep. 27, 2010.

(51) Int. Cl.
*H03L 7/00* (2006.01)

(52) U.S. Cl.
USPC .......... 331/16; 331/17; 331/177 R; 331/177 V

(58) Field of Classification Search
USPC .......... 331/14, 16, 17, 177 V, 1 A, 1 R, 177 R
See application file for complete search history.

(56) References Cited

U.S. PATENT DOCUMENTS

| 4,454,483 | A | 6/1984 | Baylor |
| 5,081,431 | A | 1/1992 | Kubo |
| 5,428,829 | A | 6/1995 | Osburn |
| 5,870,004 | A | 2/1999 | Lu |
| 6,680,632 | B1 | 1/2004 | Meyers |

(Continued)

FOREIGN PATENT DOCUMENTS

| CN | 1166729 A | 12/1997 |
| EP | 2175558 A1 | 4/2010 |

(Continued)

OTHER PUBLICATIONS

"International Search Report" mailed on Dec. 14, 2011 for International application No. PCT/EP2011/003480, International filing date:Jul. 12, 2011.

(Continued)

*Primary Examiner* — Joseph Chang
*Assistant Examiner* — Jeffrey Shin
(74) *Attorney, Agent, or Firm* — Winston Hsu; Scott Margo

(57) ABSTRACT

An integrated circuit device includes at least one controllable oscillator including a first control port and at least one further control port, at least one frequency control module including an output arranged to provide a frequency control signal. The at least one controllable oscillator further includes at least one compensation module including an output arranged to provide at least one compensation signal. The at least one compensation module includes an integrator component arranged to receive at an input thereof a signal that is representative of a difference between the indication of the frequency control signal and a reference signal, and to output an integrated difference signal. The at least one compensation module is arranged to generate the at least one compensation signal based at least partly on the integrated difference signal output by the integrator component.

16 Claims, 5 Drawing Sheets

(56) References Cited

U.S. PATENT DOCUMENTS

| | | | |
|---|---|---|---|
| 6,803,827 B1 * | 10/2004 | Kenney et al. | 331/16 |
| 6,826,246 B1 * | 11/2004 | Brown et al. | 375/376 |
| 6,990,164 B2 | 1/2006 | Bushman | |
| 7,049,866 B2 * | 5/2006 | Wilson | 327/157 |
| 7,116,183 B2 | 10/2006 | Wu | |
| 7,158,602 B2 | 1/2007 | Noguchi | |
| 7,167,056 B2 | 1/2007 | Fang | |
| 7,463,097 B2 | 12/2008 | Costa | |
| 7,471,158 B2 * | 12/2008 | Han et al. | 331/17 |
| 7,579,919 B1 | 8/2009 | Cao | |
| 7,671,688 B2 | 3/2010 | Marques | |
| 7,884,655 B2 | 2/2011 | Marton | |
| 7,940,129 B1 * | 5/2011 | Tsang et al. | 331/17 |
| 8,154,350 B2 * | 4/2012 | Faison | 331/16 |
| 2004/0232997 A1 | 11/2004 | Hein | |
| 2005/0219001 A1 | 10/2005 | Booth | |
| 2005/0231297 A1 | 10/2005 | Aparin | |
| 2006/0158264 A1 | 7/2006 | Kousai | |
| 2008/0088379 A1 | 4/2008 | Chen | |
| 2008/0157880 A1 | 7/2008 | Fayneh | |
| 2008/0248771 A1 | 10/2008 | Dunworth | |
| 2009/0261917 A1 | 10/2009 | Taghivand | |
| 2010/0097150 A1 | 4/2010 | Ueda | |
| 2010/0123490 A1 * | 5/2010 | Marton et al. | 327/156 |
| 2011/0133799 A1 * | 6/2011 | Dunworth et al. | 327/157 |
| 2011/0316595 A1 | 12/2011 | Bolton | |

FOREIGN PATENT DOCUMENTS

| | | |
|---|---|---|
| EP | 2 187 523 A1 | 5/2010 |
| JP | 6326598 | 11/1994 |
| JP | 8274541 | 10/1996 |
| JP | 10065534 | 3/1998 |
| JP | 11055034 | 2/1999 |
| KR | 1020080038504 | 5/2008 |
| WO | 9101590 | 2/1991 |
| WO | 03030352 A1 | 4/2003 |

OTHER PUBLICATIONS

"International Search Report" mailed on Feb. 29, 2012 for International application No. PCT/EP2011/005980, International filing date: Nov. 29, 2011.

* cited by examiner

INTEGRATED CIRCUIT DEVICE, ELECTRONIC DEVICE AND METHOD THEREFOR

CROSS REFERENCE TO RELATED APPLICATIONS

This is a continuation-in-part of co-pending U.S. patent application Ser. No. 13/115,126 (filed on May 25, 2011), which claims the benefit of U.S. provisional application No. 61/386,885 (filed on Sep. 27, 2010). The whole contents of the related applications are incorporated herein by reference.

BACKGROUND OF THE INVENTION

1. Field of the Invention

The field of this invention relates to an integrated circuit device, an electronic device comprising frequency signal generation circuitry, and a method therefor. The invention is applicable to, but not limited to, a method for compensating for frequency drift within a controllable oscillator.

2. Description of the Prior Art

Wireless communication systems, such as the $3^{rd}$ Generation (3G) of mobile telephone standards and technology, are well known. An example of such 3G standards and technology is the Universal Mobile Telecommunications System (UMTS™), developed by the $3^{rd}$ Generation Partnership Project (3GPP™) (www.3gpp.org). The demanding technical specifications required of a wireless telecommunication handset that support, for example, a wideband code division multiple access (WCDMA) air interface, such as may be found within a UMTS™ network, mean that synthesiser oscillators, such as voltage controlled oscillators (VCOs) or digitally controlled oscillators (DCOs), within a transceiver of such a handset must have excellent phase noise performance.

However, such wireless telecommunication handsets are required to maintain calls for extremely long periods of time. As a result, the handset's transceiver synthesisers must be capable of maintaining a frequency lock over a wide range of temperatures. Oscillators exhibit an inherent frequency drift, due to changes in operating temperature. Such a drift is hard to reduce below 40 ppm/degC. If temperature-related frequency drift were to be compensated by way of the main control port of the oscillator, for example through a conventional phase locked loop (PLL), the oscillator would require a substantial control gain (Kco). As noise on the control port is converted to oscillator phase noise, such a substantial control gain typically results in high oscillator phase noise. This is not compatible with the requirement of an excellent phase noise performance, such as is required for a wireless telecommunication handset supporting WCDMA. Generally, it is difficult to implement a wide control range without also introducing an unacceptable degradation of phase noise performance.

Known solutions to this problem typically utilise a temperature-dependent voltage signal applied to an auxiliary varactor within the oscillator (via an auxiliary control port thereof) in order to minimize oscillator frequency variations that are caused by changes in temperature. In this manner, the need for the adjustment range of the main control port of the oscillator to be sufficiently large enough to allow for such frequency variations caused by changes in temperature is substantially alleviated. As a result, the oscillator may be provided with a significantly reduced control gain (Kco), thereby reducing the phase noise of the oscillator.

However, a problem with such a solution is that the use of an auxiliary varactor with a temperature-dependent voltage signal requires accurate modelling of temperature behaviour, and typically still requires sufficient adjustment range within the main control port of the oscillator to allow sufficient margin for error. Additionally, it is difficult to generate a temperature-dependent voltage in such a manner that said voltage has low noise. Therefore, such a solution typically requires significant filtering of the temperature-dependent control voltage in order to reduce phase noise to acceptable levels.

Thus, a need exists for an improved apparatus for compensating for frequency drift within an oscillator, and method of operation therefor.

SUMMARY OF THE INVENTION

Accordingly, the invention seeks to mitigate, alleviate or eliminate one or more of the above mentioned disadvantages singly or in any combination. Aspects of the invention provide a method for compensating for frequency drift within a controllable oscillator, an integrated circuit device, frequency signal generation circuitry, and an electronic device comprising such frequency signal generation circuitry.

According to a first aspect of the invention, there is provided an integrated circuit device comprising at least one controllable oscillator. The at least one controllable oscillator comprises a first control port and at least one further control port, at least one frequency control module comprising an output operably coupled to the first control port of the at least one controllable oscillator and arranged to provide a frequency control signal thereto. The at least one controllable oscillator also comprises at least one compensation module comprising an output operably coupled with the at least one further control port of the at least one controllable oscillator and arranged to provide at least one compensation signal thereto. The at least one compensation module comprises an integrator component arranged to receive at an input thereof a signal that is representative of a difference between an indication of the frequency control signal and a reference signal, and to output an integrated difference signal. The at least one compensation module is arranged to generate the at least one compensation signal based at least partly on the integrated difference signal output by the integrator component.

Thus, in this manner, the integrator component module may provide a non-linear, time-varying signal that enables a large frequency compensation range to be achieved, whilst also enabling a sufficiently low resolution to be achieved in order to avoid obvious frequency jumps and phase in-continuity.

According to an optional feature of the invention, the at least one frequency control module may comprise a first feedback loop between an output of the at least one VCO and the first control port thereof. The at least one compensation module may comprise a second feedback loop between the first control port of the VCO and the at least one further control port thereof. Additionally, the compensation module may be arranged such that the second feedback loop comprises a bandwidth that is lower than a bandwidth of the first feedback loop.

In this manner, any control signal changes applied to the at least one further control port of the VCO by the compensation module, in order to maintain the frequency control signal at a generally consistent voltage level, will be at a slower rate. In particular, in some examples of the invention, this may be at a significantly slower rate than changes applied by the frequency control module to the frequency control signal. Accordingly, the ability of the frequency control module to control the frequency of the frequency signal output by the VCO may not be compromised.

According to an optional feature of the invention, the at least one compensation module may be arranged to generate the at least one compensation signal based upon the difference between the indication of the frequency control signal and the reference signal exceeding a threshold value.

According to an optional feature of the invention, the at least one compensation module may comprise a comparison component that is arranged to receive, at an input thereof, the indication of the frequency control signal output by the at least one frequency control module, compare the indication of the frequency control signal with the reference signal, and generate at an output thereof the signal representative of a difference between the indication of the frequency control signal and the reference signal.

According to an optional feature of the invention, the at least one compensation module may further comprise a gain block that is arranged to receive at an input thereof the integrated difference signal output by the integrator component, and thereafter to output a scaled integrated difference signal. The gain block may be arranged to configurably scale the integrated difference signal.

In this manner, the resolution of the compensation signal may be substantially optimised in relation to, for example, a subsequent digital to analogue conversion of the compensation signal.

According to an optional feature of the invention, the frequency control signal output by the at least one frequency control module may comprise a digital frequency control signal. The at least one compensation module may be arranged to generate the at least one compensation signal at least partly within a digital domain.

According to an optional feature of the invention, the at least one further control port of the at least one controllable oscillator may be arranged to receive an analogue compensation signal, and the at least one compensation module may further comprise a digital to analogue converter arranged to convert the at least one compensation signal from a digital signal to an analogue signal.

According to an optional feature of the invention, the at least one compensation module may further comprise a quantizer arranged to receive, within the digital domain, at least a part of the integrated difference signal and to map the at least part of the integrated difference signal to a pre-defined set of digital to analogue converter values.

According to an optional feature of the invention, the at least one compensation module may further comprise a delta-sigma modulation path arranged to compensate for any quantization noise introduced by the quantizer. The delta-sigma modulation path may be selectively arranged to compensate for quantization noise introduced by the quantizer.

According to a second aspect of the invention, there is provided an electronic device, for example comprising a frequency generation circuit. The electronic device (and/or frequency generation circuit) comprises at least one controllable oscillator comprising a first control port and at least one further control port, at least one frequency control module comprising an output operably coupled to the first control port of the at least one controllable oscillator and arranged to provide a frequency control signal thereto, and at least one compensation module comprising an output operably coupled with the at least one further control port of the at least one controllable oscillator and arranged to provide at least one compensation signal thereto. The at least one compensation module comprises an integrator component arranged to receive at an input thereof a signal that is representative of a difference between an indication of the frequency control signal and a reference signal, and to output an integrated difference signal. The at least one compensation module is arranged to generate the at least one compensation signal based at least partly on the integrated difference signal output by the integrator component.

According to a third aspect of the invention, there is provided a method for compensating for frequency drift within a controllable oscillator. The method comprises receiving an indication of a frequency control signal that is provided to a first control port of the controllable oscillator, comparing the indication of the frequency control signal with a reference signal, performing integration of a difference between the indication of the frequency control signal and the reference signal in order to generate an integrated difference signal, generating at least one compensation signal based at least partly on the integrated difference signal, and providing the at least one compensation signal to at least one further control port of the controllable oscillator.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

The present invention will now be described with reference to the compensation of a digitally controlled oscillator (DCO) for use within a transceiver of a wireless communication unit, for example as may be adapted to support a wideband code division multiple access (WCDMA) air interface such as may be found within a UMTS™ (Universal Mobile Telecommunications System) network. However, it will be appreciated that the inventive concept described herein is not limited to use within such a DCO application, and may equally be implemented within any alternative applications in which compensation for frequency drift of a controllable oscillator or similar device is desirable/required.

Figure 1:
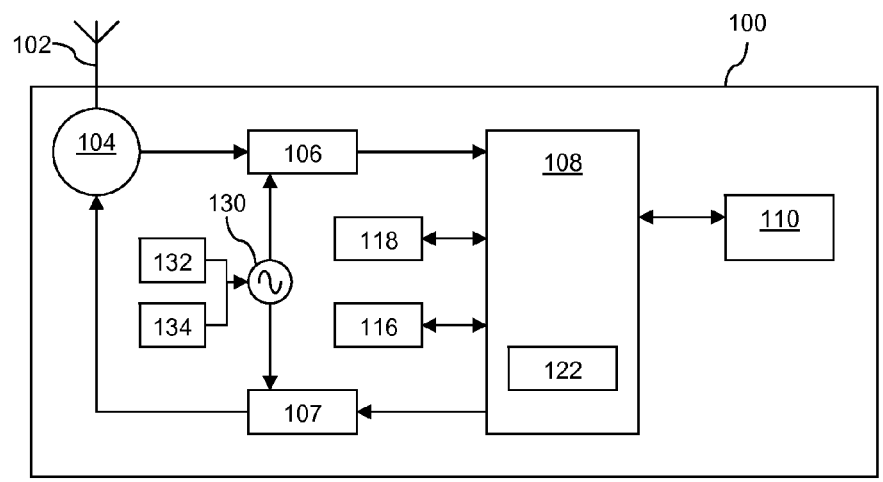
FIG. 1 illustrates an example of a simplified block diagram of part of an electronic device adapted to support the inventive concepts of an example of the present invention.

Referring first to FIG. 1, there is illustrated an example of a simplified block diagram of part of an electronic device 100 adapted to support the inventive concept of an example of the present invention. The electronic device 100, in the context of the illustrated example embodiment of the invention, is a wireless telecommunication handset. As such, the electronic device 100 comprises an antenna 102 and contains a variety of well known radio frequency transceiver components or circuits operably coupled to the antenna 102. In particular for the illustrated example, the antenna 102 is operably coupled to a duplex filter or antenna switch 104 that provides isolation between a receiver chain 106 and a transmitter chain 107. As is known in the art, the receiver chain 106 typically includes radio frequency receiver circuitry for providing reception, filtering and intermediate or base-band frequency conversion. Conversely, the transmitter chain 107 typically includes radio frequency transmitter circuitry for providing modulation and power amplification of a transmit signal to be radiated from the antenna 102.

For completeness, the electronic device 100 further comprises a signal processor 108. An output from the signal processor 108 may be provided to a suitable user interface (UI) 110 comprising, for example, a display, keypad, microphone, speaker etc. The signal processor 108 may also be coupled to a memory element 116 that stores operating regimes, such as decoding/encoding functions and the like and may be realised in a variety of technologies such as (volatile) random access memory (RAM), (non-volatile) read only memory (ROM), Flash memory or any combination of these or other memory technologies. A timer 118 is typically coupled to the signal processor 108 to control the timing of operations within the electronic device 100.

As is known in the art, the transmitter and receiver chains of such a wireless telecommunication handset require accurate frequency signals in order to correctly perform their required functions. Typically, such frequency signals are provided by way of one or more controllable oscillators, such as one or more voltage controlled oscillators (VCOs) and/or one or more digitally controlled oscillators (DCOs), illustrated generally at 130. Such a controllable oscillator 130 is arranged to output a defined frequency signal, which may subsequently be modified (e.g. phase shifted and/or frequency multiplied/ frequency divided) as required for use by the respective transmitter/receiver chain 107/106. As previously mentioned, the demanding specifications required of such wireless telecommunication handsets mean that such controllable oscillators within a transceiver of such a wireless handset must have excellent phase noise performance, whilst being able to maintain a call indefinitely. As a result, their transceiver synthesisers must be capable of maintaining a frequency lock under various conditions, including over a wide range of temperatures.

Thus, the electronic device (e.g., the wireless telecommunication handset) 100 of FIG. 1 comprises at least one frequency control module, illustrated generally at 132, arranged to provide a frequency control signal to a first (main) control port of the controllable oscillator 130 in order to maintain a required frequency lock of the signal output by the controllable oscillator 130. The electronic device (e.g., the wireless telecommunication handset) 100 of FIG. 1 further comprises at least one compensation module, illustrated generally at 134, arranged to provide at least one compensation signal to at least one further (auxiliary) control port of the controllable oscillator 130.

Figure 2:
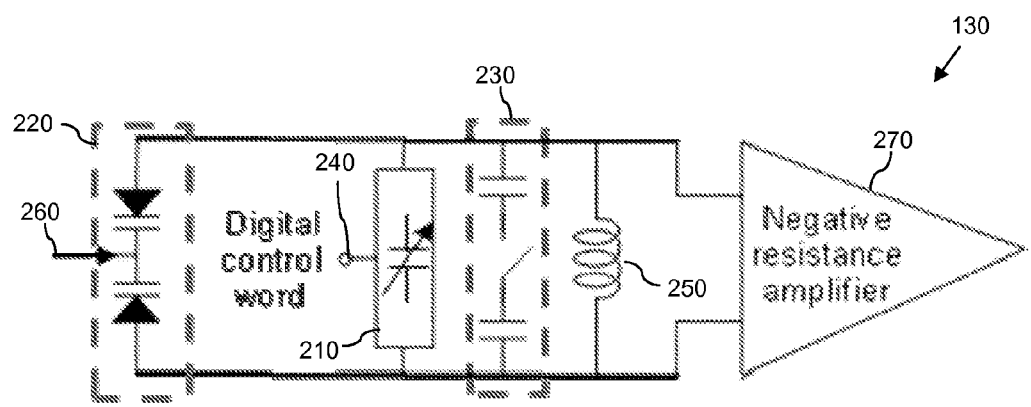
FIG. 2 illustrates a simplified example of a digitally controlled oscillator circuit.

FIG. 2 illustrates a simplified example of a digitally controlled oscillator (DCO), such as may be used to implement the, or each, controllable oscillator 130 of the electronic device (e.g., the wireless telecommunication handset) 100 of FIG. 1. The DCO 130 comprises a first, 'main' control port 240, for example to which the frequency control module 132 of FIG. 1 may be operably coupled. In the illustrated example, this first control port 240 is arranged to receive a digital control word, which is provided to a first, digitally controlled, varactor circuit illustrated generally at 210. In this manner, a control signal received at the first, main control port 240 of the DCO 130 may be used to at least partially control a resonant frequency of a resonant circuit of the DCO 130, for example to maintain a desired output frequency of the DCO 130 by way of, for example, a phase locked loop (PLL).

The DCO circuit 130 further comprises a further, 'auxiliary' control port 260, for example to which the compensation module 134 of FIG. 1 may be operably coupled. In the illustrated example, the auxiliary control port 260 is arranged to receive an analogue control signal, such as a voltage control signal, which is provided to a further, e.g. voltage controlled, varactor circuit illustrated generally at 220. In this manner, a control signal received at the further, auxiliary control port 260 of the DCO 130 may be used to further control a resonant frequency of a resonant circuit of the DCO 130, for example to compensate for any frequency drift due to, say, changes in temperature or the like. A benefit of using an analogue varactor to compensate for frequency drift in this manner is that it reduces the number of relatively digital tracking units, which are typically relative large and require complex routing of signals, as well as substantially avoiding phase/frequency jumps caused by mismatches between the tracking units in the frequency control module 132 and in the compensation module 134.

In one example, by enabling frequency drift to be compensated for outside of a main frequency control loop, for example such a main frequency control loop being provided by a PLL coupled to the main control port 240 of the DCO 130, the control gain required for the main control port 240 is not required to be excessively large in order to compensate for such frequency drift, thereby enabling low DCO phase noise to be achieved through the main control port 240.

In the illustrated example, the DCO 130 comprises a further variable capacitive circuit, illustrated generally at 230, comprising one or more selectable capacitive circuits arranged to enable channel selection etc. The DCO circuit 130 further comprises at least one inductance circuit, illustrated generally at 250, operably coupled in parallel with the capacitive circuits 210, 220, 230. In this manner, the inductance circuit 250 and the capacitive circuits 210, 220, 230 act as a resonant circuit, which in cooperation generate an oscillating signal at the resonant frequency of the resonant circuit. As is known, by providing one or more varactor circuits 210, 220 within the resonant circuit of the DCO 130, the resonant frequency of the resonant circuit may be varied, thereby varying the frequency of the oscillating signal generated thereby. The DCO circuit 130 further comprises an amplifier circuit, which in the illustrated example comprises a negative resistance amplifier 270, which amplifiers the oscillating signal generated by the resonant circuit to provide an adequate gain of the oscillating signal.

Figure 3:
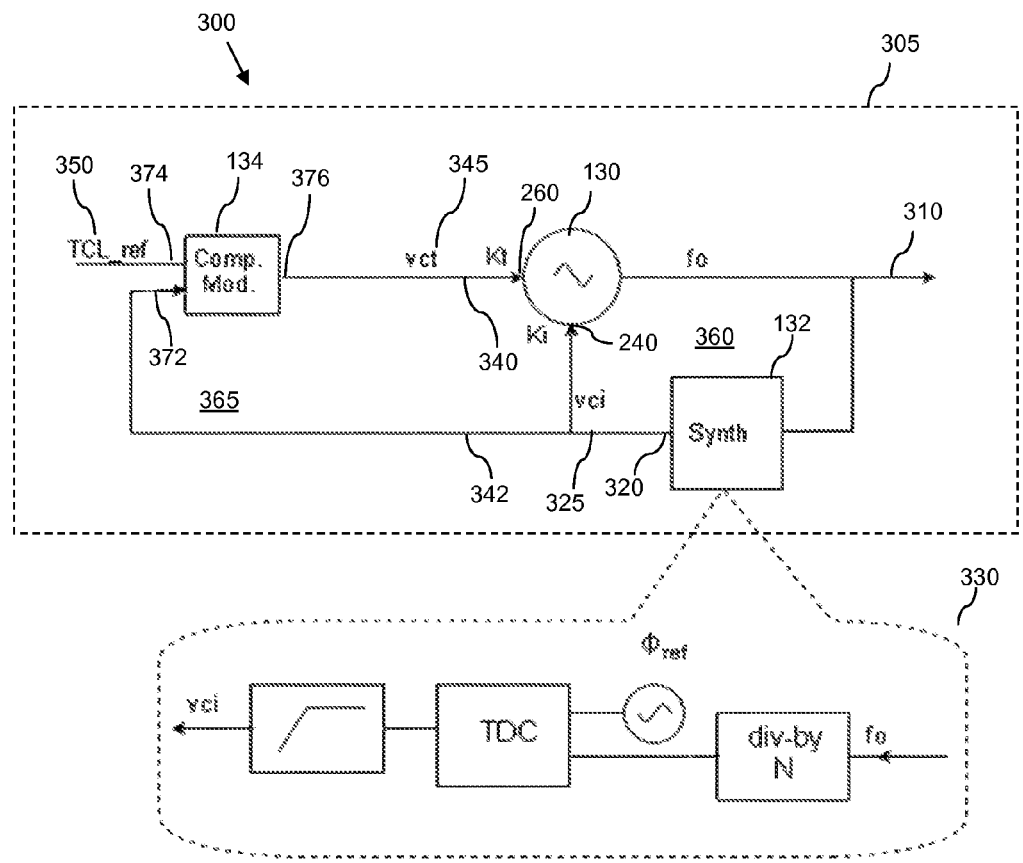
FIG. 3 illustrates an example of a frequency signal generation circuitry according to an example embodiment of the present invention.

Referring now to FIG. 3, there is illustrated an example of a frequency signal generation circuitry 300 according to some example embodiments of the present invention, the frequency signal generation circuitry 300 being arranged to generate a frequency signal (fo) 310, for example such as may be provided to the transmitter and/or receiver chains 107, 106 of the electronic device (e.g., the wireless telecommunication handset) 100 of FIG. 1. For the illustrated example, the frequency signal generation circuitry 300 is implemented within an integrated circuited device 305. It is contemplated that such integrated circuit device 305 may further comprise some or all of the transmitter and/or receiver chain components of the electronic device (e.g., the wireless telecommunication handset) 100.

In this example, the frequency signal generation circuitry 300 comprises at least one controllable oscillator component, such as DCO 130 of FIGS. 1 and 2, comprising a first control port (e.g. main control port 240 illustrated in FIG. 2) and at least one further control port (e.g. auxiliary control port 260 illustrated in FIG. 2). The frequency signal generation circuitry 300 further comprises at least one frequency control module, such as the frequency control module 132 illustrated in FIG. 1, comprising an output 320 operably coupled to the first control port 240 of the DCO 130 and arranged to provide a frequency control signal (vci) 325 thereto. For the example illustrated in FIG. 3, the frequency control module 132 comprises a phase locked loop (PLL), as partially illustrated at 330, arranged to provide a feedback loop between the frequency signal (fo) 310 output by the DCO 130 and the main control port 240 thereof. PLLs are well known in the art and as such the PLL 330 illustrated in FIG. 3 need not be described in any further detail herein.

In this example, the frequency signal generation circuitry 300 further comprises at least one compensation module, such as the compensation module 134 illustrated in FIG. 1. The compensation module 134 comprises an output 340 operably coupled to the at least one further (auxiliary) control port 260 of the DCO 130, and is arranged to provide at least one compensation signal (vct) 345 thereto. The compensation module 134 is arranged to receive at an input 342 thereof an indication of the frequency control signal (vci) 325 output by the frequency control module 132, to compare the indication of the frequency control signal (vci) 325 to a reference signal (TCL_ref) 350, and to generate the compensation signal (vct) 345 based at least partly on the comparison of the indication of the frequency control signal (vci) 325 with the reference signal (TCL_ref) 350.

By comparing (at least an indication of) the frequency control signal (vci) 325 provided to the main control port 240 of the DCO 130 with a reference signal (TCL_ref) 350, any variation between the frequency control signal (vci) 325 and the reference signal (TCL_ref) 350 can be detected, and the compensation signal (vct) 345 set or modified accordingly. For example, the compensation signal (vct) 345 may be set to represent a difference between the frequency control signal (vci) 325 and the reference signal (TCL_ref) 350. In this manner, the compensation module 134 (and varactor circuit 220 of the DCO 130) may be arranged to control the resonant frequency of the resonant circuit within the DCO 130 such that the frequency control signal (vci) 325 output by the frequency control module 132 is maintained at a generally consistent value (relative to the reference signal (TCL_ref) 350), for example by maintaining the frequency control signal (vci) 325 generally equal to the reference signal (TCL_ref) 350. In this manner, the compensation signal (vct) 345 is able to effectively compensate for any frequency drift within the DCO 130 by maintaining the frequency control signal (vci) 325 at a generally consistent value, for example comprising a digital control word value generally centred within the tuning curve for the main control port 240 of the DCO 130.

In this manner, the frequency control signal (vci) 325 is not required to compensate for frequency drift within the DCO 130, and as a result the main control port 240 and respective varactor circuit 210 are not required to provide a large control gain (Ki), thereby enabling a low phase noise to be achieved within the main control loop comprising the frequency control module 132. The reference signal (TCL_ref) 350 may be selected to be any suitable value, and in the illustrated example may determine a digital control word value at which the frequency control signal (vci) 325 will generally be maintained. Thus, for example, the reference signal (TCL_ref) 350 may be selected such that the frequency control signal (vci) 325 may be generally maintained around a calibration control word used during DCO sub-band selection (typically at or near a peak of the control gain (Kdco) curve for the DCO 130).

For the illustrated example, the compensation module 134 comprises an integrator component arranged to receive at an input thereof a signal representative of a difference between the (at least indication of the) frequency control signal (vci) 325 and the reference signal (TCL_ref) 350, and to output an integrated difference signal, for example integrated with respect to time; and the compensation module 134 is arranged to generate the at least one compensation signal (vct) 345 based at least partly on the integrated difference signal output by the integrator component. In this manner, the integrator component module is used to accumulate the difference between the at least indication of the frequency control signal (vci) 325 and the reference signal (TCL_ref) 350, and provide a monotonic output signal (Vct) 345.

Figure 4:
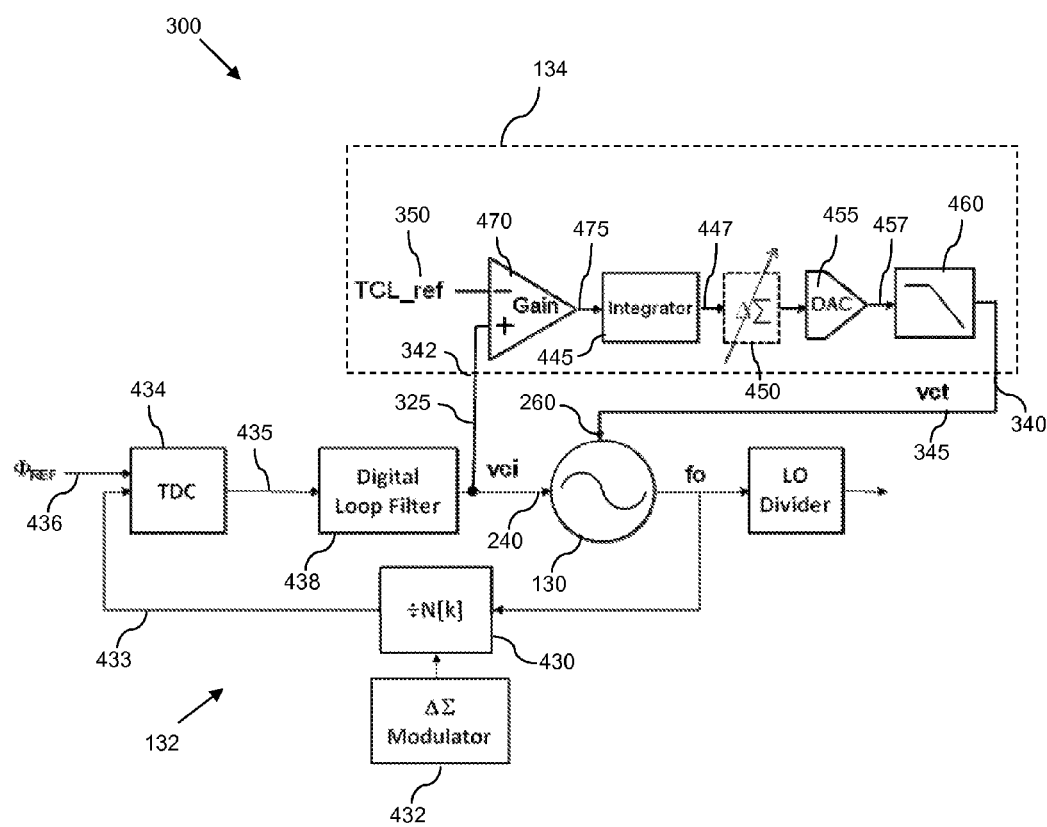
FIG. 4 illustrates a simplified block diagram of an example of a compensation module.

For example, FIG. 4 illustrates a simplified block diagram of an example of the compensation module 134 shown in greater detail. The compensation module 134 comprises a comparison component 470 arranged to receive at an input thereof at least an indication of the frequency control signal (vci) 325 output by the frequency control module 132, which in the illustrated example comprises a phase locked loop (PLL). In particular for the illustrated example, the frequency control module 132 is arranged to generate a digital frequency control signal (vci) 325, for example comprising a digital control word, and comprises a frequency divider component 430, operably coupled to a delta-sigma modulator 432, which provides a scaled version 433 of the frequency signal (fo) output by the DCO 130 to a time to digital converter (TDC) 434. The TDC 434 receives the scaled version of the frequency signal 433, and a frequency reference signal 436, and outputs a digital signal 435 representative of a difference between the scaled version of the frequency signal 433 and the frequency reference signal 436. The digital signal 435 is then filtered by a digital loop filter 438 to generate the frequency control signal (vci) 325.

The comparison component 470 is further arranged to receive the reference signal (TCL_ref) 350 and to compare the at least indication of the frequency control signal (vci) 325 with the reference signal (TCL_ref) 350, and to generate at an output thereof a signal 475 representative of a difference between the at least indication of the frequency control signal (vci) 325 and the reference signal (TCL_ref) 350. In the illustrated example, the frequency control module 132 is arranged to generate a digital frequency control signal (vci) 325, for example comprising a digital control word. Accordingly, the comparison component 470 may comprise a digital gain block, and the reference signal (TCL_ref) 350 may also comprise a digital signal comprising, for example, a digital reference word. Thus, the compensation module 134 is arranged to generate the compensation signal (vct) 345 at least partly within a digital domain.

The (digital) signal 475 output by the comparison component is then provided to integrator component 445, which performs integration (for example with respect to time) of the received signal 475, and outputs an integrated difference signal 447. The integrated difference signal 447 may then be modulated, for example by modulator 450, before being provided to, in the illustrated example, a digital to analogue converter (DAC) 455. The analogue signal 457 output by the DAC 455 is then filtered by a low pass filter 460 to generate the compensation signal (vct) 325 provided to the auxiliary control port 260 of the DCO 130. For the illustrated example, the compensation module 134 comprises a negative feedback system. Accordingly, where, say, a temperature change causes an increase in the DCO intrinsic frequency, the compensation module 134 increases the value of the compensation signal (vct) 325 in order to maintain the signal generation circuitry 300 fixed output frequency (fo) (DCO frequency is negative proportional to compensation signal (vct) 325).

Figure 5:
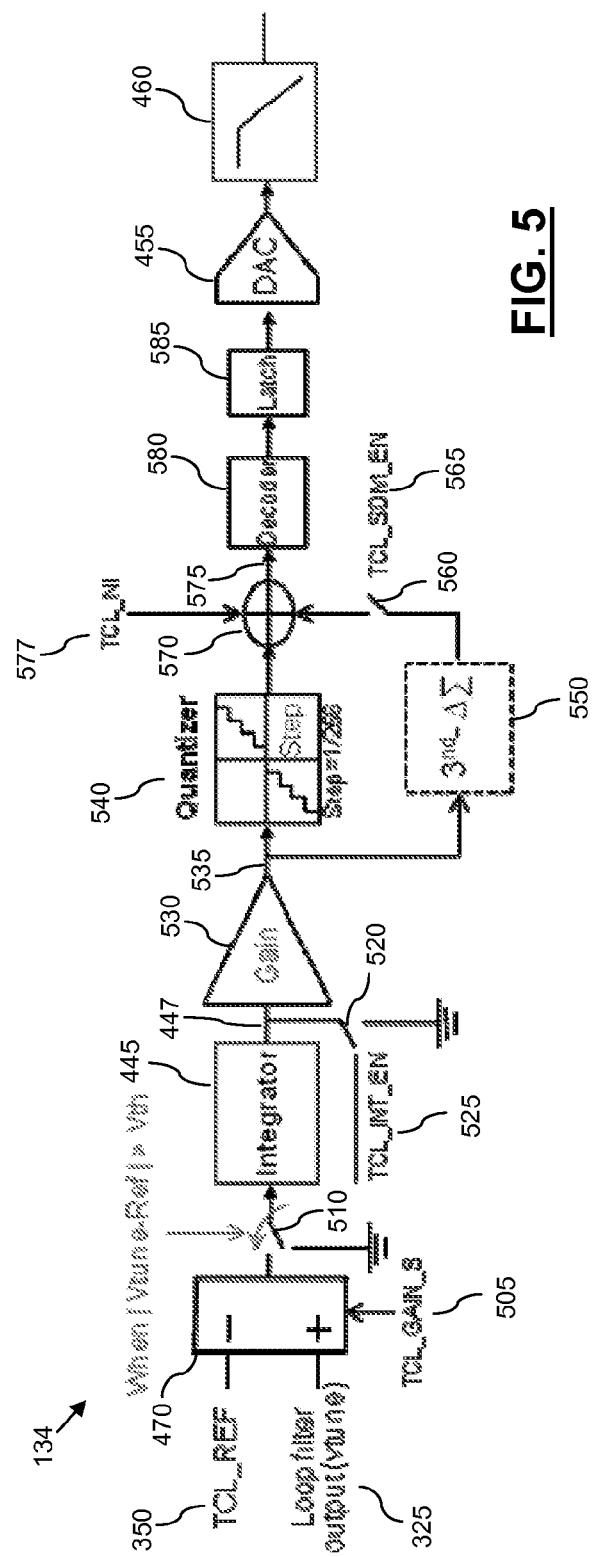
FIG. 5 illustrates a simplified block diagram of an alternative example of a compensation module.

Referring now to FIG. 5, there is illustrated a simplified block diagram of a further example of the compensation module 134 of FIG. 1. The compensation module 134 comprises a comparison component 470 arranged to receive at a first input thereof at least an indication of the frequency control signal 325 output by the frequency control module 132, and at a second input thereof the reference signal (TCL_ref) 350. In the illustrated example, the comparison component 470 comprises a digital gain block, and is arranged to receive a gain configuration signal illustrated generally at 505 for configuring the gain applied by the comparison component 470.

The digital signal output by the comparison component 470, which comprises at least an indication of a difference between the at least indication of the frequency control signal 325 and the reference signal (TCL_ref) 350, is selectively provided to the integrator component 445. In particular for the illustrated example, the digital signal output by the comparison component 470 is provided to the integrator component 445 when the difference between the at least indication of the frequency control signal 325 and the reference signal (TCL_ref) 350 exceeds a threshold value. For example, a selector component, illustrated generally at 510, may be arranged to operably couple the comparison component 470 to the integrator component such that the digital signal output by the comparison component 470 is provided to the integrator component 445 when the difference between the at least indication of the frequency control signal 325 and the reference signal (TCL_ref) 350 exceeds a threshold value. Conversely, the selector component 510 may be arranged to operably couple the input of the integrator component 445 to, say, a ground plane such that a 'zero' signal is provided to the integrator component 445 when the difference between the at least indication of the frequency control signal 325 and the reference signal (TCL_ref) 350 is below the threshold value.

The integrator component 445 performs integration (for example with respect to time) of the received signal, which in the illustrated example comprises the digital signal output by the comparison component 470 when the difference between the at least indication of the frequency control signal 325 and the reference signal (TCL_ref) 350 exceeds a threshold value and the ground signal when the difference between the at least indication of the frequency control signal 325 and the reference signal (TCL_ref) 350 is below the threshold value. In this manner, toggling of the compensation signal (vct) 345 when the temperature variation is very small may be substantially avoided. This may help avoid possible unnecessary disturbances, enabling the frequency control module 132 to operate as a single close loop without influence from the compensation module 134 under such conditions.

In the example illustrated in FIG. 5, the integrated difference signal 447 output by the integrator component 445 is provided to a gain block 530 arranged to receive at an input thereof the integrated difference signal 447 and to output a scaled integrated difference signal 535. For example, the gain block 530 may be arranged to configurably scale the integrated difference signal to fit the analogue levels of the DAC 455. A switching element 520 is arranged to selectively couple the input of the gain block 530 to ground in accordance with a compensation enable signal 525, such that when the switching element is configured to couple the input of the gain block 530 to ground, the integrated difference signal 447 output by the integrator component is effectively overridden, and a 'zero' signal is received by the gain block 530. In this manner, the compensation module 134 may be enabled/disabled via the compensation enable signal 525.

The scaled integrated difference signal 535 output by the gain block 530 is provided to a quantizer 540 arranged to receive at least a part of the (scaled) integrated difference signal 535 and to map the at least part of the integrated difference signal 535 to a pre-defined set of DAC values. In the example illustrated in FIG. 5, the compensation module 134 further comprises a delta-sigma modulation path 550 arranged to compensate for quantization noise introduced by the quantizer 540. In the illustrated example, the delta-sigma modulation path 550 comprises a $3^{rd}$ order delta-sigma modulator 550 arranged to receive at least a part of the (scaled) integrated difference signal 535, for example a number of the less significant bits within the integrated difference signal 535.

A switching element 560 is arranged to selectively couple the modulation signal output by the delta-sigma modulator 550 to the DAC value output by the quantizer 540, in accordance with a delta-sigma modulation enable signal 585. In this manner, when the switching element 560 is configured to couple the modulation signal output by the delta-sigma modulator 550 to the DAC value output by the quantizer 540, the modulation signal output by the delta-sigma modulator 550 is combined with the DAC value output by the quantizer 540, at 570, to create a modulated DAC value 575. Conversely, when the switching element 560 is configured to not couple the modulation signal output by the delta-sigma modulator 550 to the DAC value output by the quantizer 540, the delta-sigma modulation path is effectively disabled. In this manner, the delta-sigma modulation path may be enabled/disabled via the delta-sigma modulation enable signal 585. In the illustrated example, a further signal (TCL_IN) 577 is illustrated, and mixed with the DAC value output by the quantizer 540 and (when coupled thereto) the modulation signal output by the delta-sigma modulator 550. This further signal (TCL_IN) 577 comprises an initial value output to set an analogue varactor voltage for the auxiliary control port 260 of the DCO 130 during sub-band calibration.

The modulated DAC value 575 is then provided to a decoder 580, which performs decoding of the modulated DAC value 575. For example, for some DAC implementations, coarse and fine bits may be used to simplify the control thereof and reduce the routing. The decoder may thus be used to provide the different coarse and fine DAC signals. The decoded and modulated DAC value is then provided to latch 585, which provides a clocked DAC value to the DAC 455 based on the received decoded and modulated DAC value output by the decoder 580.

For the illustrated examples, the compensation signal (vct) 345 is generated based on a substantially direct comparison of the frequency control signal (vci) 325 provided to the main control port 240 of the DCO 130 and the reference signal (TCL_ref) 350. However, in some examples the compensation signal (vct) 345 may equally be generated based on a comparison of an 'indication' of the frequency control signal (vci) 325 with a reference signal (TCL_ref) 350. For example, the compensation signal (vct) 345 may be generated based on a comparison of a fraction (1/n) of the frequency control signal (vci) 325 (e.g. provided by way of a voltage divider circuit or the like). In this manner, the frequency control signal (vci) 325 may be generally maintained at a voltage substantially equal to n*TCL_ref.

As illustrated in FIG. 3, the frequency control module 132 may comprise a first feedback loop 360 (in a form of a PLL for the illustrated example) between the output 310 of the DCO 130 and the first, main control port 240 thereof. In addition, for the illustrated example the compensation module 134 comprises a second feedback loop 365 between the first, main control port 240 of the DCO 130 and the second, auxiliary control port 260 thereof. In effect, this second feedback loop 365 of the compensation module 134 provides an extension to the first feedback loop 360 of the frequency control module 132. In some examples, the compensation module 134 may be arranged such that the second feedback loop 365 comprises a bandwidth lower than a bandwidth of the first feedback loop 360. In this manner, any control signal changes applied to the auxiliary control port 260 of the DCO 130 by the compensation module 134, in order to maintain the frequency control signal (vci) 325 at a generally consistent voltage level, will be at a slower rate than changes applied by the frequency control module 132 to the frequency control signal (vci) 325. Accordingly, the ability of the frequency control module 132 to control the frequency of the frequency signal (fo) 310 output by the DCO 130 is not compromised.

For example, a temperature change +dT may cause a frequency drift within the DCO 130 of −a.dT, resulting in a corresponding change in the frequency of the frequency signal (fo) 310 output by the DCO 130. In response to such a change in the frequency of the frequency signal (fo) 310, the frequency control module 132 is arranged to increase the value of the frequency control signal (vci) 325 by +dF/Ki in order to correct the frequency of the frequency signal (fo) 310. In response to such a change in the frequency of the frequency control signal (vci) 325, the compensation module 134 increases (at a slower rate) the value of the compensation signal (vct) 345 by +dF/Kt, thereby causing the value of the frequency control signal (vci) 325 to be returned to its original level (e.g. equal to that of the reference signal (TCL_ref) 350). Since the bandwidth of the second feedback loop 365 is lower than that of the first feedback loop 360, the frequency control module 132 is able to substantially maintain the frequency of the frequency signal (fo) 310 at the desired frequency, whilst the compensation module 134 causes the value of the frequency control signal (vci) 325 to be returned to its original level.

In particular, in some examples the compensation module 134 may be arranged such that the second feedback loop 365 comprises a bandwidth significantly lower than the bandwidth of the first feedback loop 360 (for example the second feedback loop 365 having a bandwidth of less than 1 kHz as compared with, say, a bandwidth of 100 kHz. for the first feedback loop 360). In this manner, the loop dynamics of the frequency control module 132 will not be significantly affected, thereby enabling low phase noise levels and fast lock times to be perceived at the output (fo) 310 of the DCO 130.

It is contemplated that for some example embodiments of the present invention, the compensation module 134 may be designed to compensate for, say, temperature-induced changes within the DCO 130. Accordingly, a time constant of approximately 1 ms (millisecond) or more may be sufficient to track such changes. Although localised heating due to, for example, on-chip power consumption may cause faster changes, the frequency control module 132 is typically capable of correcting for these in the short term, with the compensation module 132 eventually providing the necessary compensation thereafter.

The generation of the compensation signal (vct) 345 for the illustrated example is not temperature-dependent, and as such the compensation module 134 is capable of compensating for substantially any mid-/long-term frequency changes of the DCO 130, and not just frequency drift resulting from temperature variations. Advantageously, the illustrated example of the present invention enables a wide compensation range to be achieved with negligible effect on phase noise performance for the DCO 130. Furthermore, the compensation module 134 of the illustrated example is relatively simple to implement, thereby placing substantially no demand on modelling of detailed temperature-dependent behaviour of DCOs, and having a simple and well defined interaction with the frequency control module 132.

During calibration of the DCO 130, for example during sub-band selection for the DCO 130, the compensation signal (vct) 345 may be set to a known calibration value. For example, the compensation signal (vct) 345 may be set to a calibration value (vctcal) located substantially at the centre of the tuning curve (Kt) for the auxiliary control port 260 to which it is provided. In this manner, after calibration, with both feedback loops 360, 365 active, the compensation signal (vct) 345=vctcal, whilst the frequency control signal (vci) 325 is approximately equal to vcical, where vcical is a value of the frequency control signal (vci) 325 to which the DCO 130 is calibrated. Immediately after calibration, vci may move a small amount away from vcical during PLL locking. This is due to the finite size of the DCO frequency bands. The compensation module 134 of the illustrated example may provide the additional benefit of holding the frequency control signal (vci) 325 generally around vcical through the adjustment range of the compensation module 134 for any DCO band. In this manner, the compensation module 134 may reduce the observed variation in the control gain (Ki) for the main control port 240 of the DCO 130, and the overall loop gain of the frequency control module 132. If the total adjustment range for the auxiliary control port 260 of the DCO 130 is frange, setting the compensation signal (vct) 345 to a calibration value (vctcal) located substantially at the centre of the tuning curve (Kt) for the auxiliary control port 260 will allow approximately symmetric adjustment by the compensation module 134 of +/−frange/2.

However, if such calibration is performed at, say, a temperature extreme limit, such calibration will result in the VCO 130 being calibrated with the compensation signal (vct) 345 being centred within the tuning curve (Kt) for the auxiliary control port 260 for that temperature extreme limit. Accordingly, only approximately half the adjustment range will be useful, since the remainder of the adjustment range will be beyond the temperature extreme limit. Thus, in some example embodiments of the present invention the value to which the compensation signal (vct) 345 is set during calibration of the VCO 130 is made/selected as a function of temperature.

The applicant's co-pending U.S. patent application U.S. Ser. No. 13/115,126 discloses examples of calibration circuitry and methods of calibrating that may be implemented with the compensation module 134 herein described. Accordingly, the applicant's co-pending U.S. patent application U.S. Ser. No. 13/115,126 is incorporated in its entirety herein by reference.

Advantageously, a compensation module 134 has been herein described that enables frequency drift within a controllable oscillator to be compensated for, without requiring a significantly large control gain to be implemented within the main control port of the controllable oscillator (and thus without incurring a significantly large phase noise), and without requiring accurate modelling of temperature behaviour etc. of the controllable oscillator. Furthermore, the example embodiments herein described further enable a large frequency compensation range to be achieved whilst also enabling a sufficiently low resolution to be achieved in order to avoid obvious frequency jumps and phase in-continuity.

Figure 6:
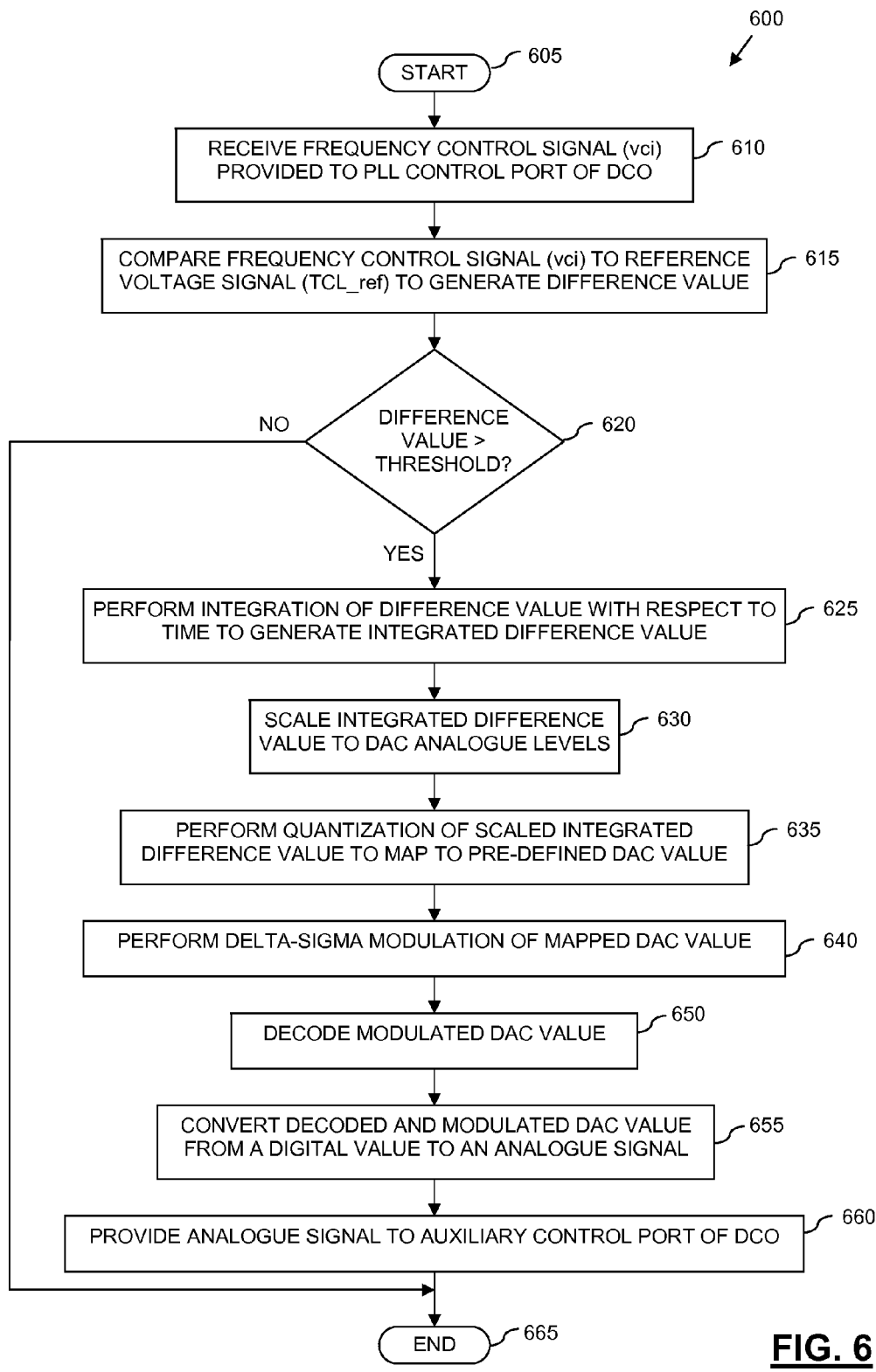
FIG. 6 illustrates a simplified flowchart of an example of a method for compensating for frequency drift within a controllable oscillator according to an example embodiment of the present invention.

Referring now to FIG. 6 there is illustrated a simplified flowchart 600 of an example of a method for compensating for frequency drift within a controllable oscillator such as the DCO 130 in FIGS. 3 to 5, for example due to temperature variations, etc., according to some example embodiments of the present invention. The method starts at step 605 and moves on to step 610 where a frequency control signal (e.g. vci 325 in FIGS. 3 to 5) provided to a first (main) control port of the controllable oscillator, or at least an indication thereof, is received. Next, at step 615, the received frequency control signal (vci) is compared to a reference signal (e.g. TCL_ref 350 in FIGS. 3 to 5). If, at step 620, it is determined that a difference between the received frequency control signal (vci) and the reference signal (TCL_ref) is greater than a threshold value, the method moves on to 625, where integration is performed on the difference value, for example with respect to time, to generate an integrated difference value. The integrated difference value is then scaled to analogue DAC values, at step 630. Next, at 635, quantization of the scaled integrated difference value is performed to map the scaled integrated difference value to a pre-defined DAC value. Delta-sigma modulation of the mapped DAC value is then performed, at step 640, to compensate for quantization noise. The modulated DAC value is then decoded at step 650, and then converted from a digital value to an analogue value, at step 655, to generate a compensation signal which is then provided to an auxiliary control port of the controllable oscillator (DCO) at step 660. The method then ends at 665.

The illustrated example embodiments of the present invention have, for the most part, been implemented using electronic components and circuits known to those skilled in the art. Accordingly, details have not been explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an', limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. An integrated circuit device comprising:
   at least one controllable oscillator comprising a first control port and at least one further control port;
   at least one frequency control module comprising an output that is operably coupled to the first control port of the at least one controllable oscillator and arranged to provide a frequency control signal thereto; and
   at least one compensation module comprising an output that is operably coupled with the at least one further control port of the at least one controllable oscillator and arranged to provide at least one compensation signal thereto,
   wherein the at least one compensation module comprises an integrator component arranged to receive at an input thereof a signal that is representative of a difference between an indication of the frequency control signal and a reference signal, and to output an integrated difference signal;
   the at least one compensation module is arranged to generate the at least one compensation signal based at least partly on the integrated difference signal output by the integrator component; and
   the integrator component is a digital integrator.

2. The integrated circuit device of claim 1 wherein the at least one frequency control module comprises a first feedback loop between an output of the at least one controllable oscillator and the first control port thereof.

3. The integrated circuit device of claim 2 wherein the at least one compensation module comprises a second feedback loop between the first control port of the controllable oscillator and the at least one further control port thereof.

4. The integrated circuit device of claim 3 wherein the at least one compensation module is arranged such that the second feedback loop comprises a bandwidth lower than a bandwidth of the first feedback loop.

5. The integrated circuit device of claim 1 wherein the at least one compensation module is arranged to generate the at least one compensation signal based upon the difference between the indication of the frequency control signal and the reference signal exceeding a threshold value.

6. The integrated circuit device of claim 1 wherein the at least one compensation module comprises a comparison component arranged to:
   receive at an input thereof the indication of the frequency control signal output by the at least one frequency control module;
   compare the indication of the frequency control signal with the reference signal; and
   generate at an output thereof the signal that is representative of a difference between the indication of the frequency control signal and the reference signal.

7. The integrated circuit device of claim 1 wherein the at least one compensation module further comprises a gain block arranged to receive at an input thereof the integrated difference signal output by the integrator component, and to output a scaled integrated difference signal.

8. The integrated circuit device of claim 7 wherein the gain block is arranged to configurably scale the integrated difference signal.

9. The integrated circuit device of claim 1 wherein the frequency control signal output by the at least one frequency control module comprises a digital frequency control signal, and the at least one compensation module is arranged to generate the at least one compensation signal at least partly within a digital domain.

10. The integrated circuit device of claim 9 wherein the at least one further control port of the at least one controllable oscillator is arranged to receive an analogue compensation signal, and the at least one compensation module further comprises a digital to analogue converter arranged to convert the at least one compensation signal from a digital signal to an analogue signal.

11. The integrated circuit device of claim 10 wherein the at least one compensation module further comprises a quantizer arranged to receive, within the digital domain, at least a part of the integrated difference signal and to map the at least part of the integrated difference signal to a pre-defined set of digital to analogue converter values.

12. The integrated circuit device of claim 11 wherein the at least one compensation module further comprises a delta-sigma modulation path arranged to compensate for quantization noise introduced by the quantizer.

13. The integrated circuit device of claim 12 wherein the delta-sigma modulation path is selectively arranged to compensate for quantization noise introduced by the quantizer.

14. The integrated circuit device of claim 1 wherein the at least one compensation module is an open circuit when the difference between the indication of the frequency control signal and the reference signal below a threshold value.

15. An electronic device comprising:
   at least one controllable oscillator comprising a first control port and at least one further control port;
   at least one frequency control module comprising an output that is operably coupled to the first control port of the at least one controllable oscillator and arranged to provide a frequency control signal thereto; and at least one compensation module comprising an output that is operably coupled with the at least one further control port of the at least one controllable oscillator and arranged to provide at least one compensation signal thereto,
   wherein the at least one compensation module comprises an integrator component arranged to receive at an input thereof a signal that is representative of a difference between an indication of the frequency control signal and a reference signal, and to output an integrated difference signal;
   the at least one compensation module is arranged to generate the at least one compensation signal based at least partly on the integrated difference signal output by the integrator component; and
   the integrator component is a digital integrator.

16. A method for compensating for frequency drift within a controllable oscillator, the method comprising:
   receiving at least an indication of a frequency control signal provided to a first control port of the controllable oscillator;
   comparing an indication of the frequency control signal with a reference signal;
   performing digital integration of a difference between the indication of the frequency control signal and the reference signal to generate an integrated difference signal;
   generating at least one compensation signal based at least partly on the integrated difference signal; and
   providing the at least one compensation signal to at least one further control port of the controllable oscillator.

* * * * *